United States Patent [19]

Roberts

[11] Patent Number: 5,336,908
[45] Date of Patent: Aug. 9, 1994

[54] INPUT EDS PROTECTION CIRCUIT

[75] Inventor: Gregory N. Roberts, Boise, Id.

[73] Assignee: Micron Semiconductor, Inc., Boise, Id.

[21] Appl. No.: 116,100

[22] Filed: Sep. 2, 1993

Related U.S. Application Data

[63] Continuation of Ser. No. 935,605, Aug. 26, 1992, abandoned.

[51] Int. Cl.$^5$ .................. H01L 27/04; H01L 29/08; H01L 29/52
[52] U.S. Cl. .................. 257/173; 257/355; 257/154
[58] Field of Search ............... 257/141, 149, 173, 357, 257/154, 141, 149, 173, 357, 358, 360

[56] References Cited

U.S. PATENT DOCUMENTS

| | | | |
|---|---|---|---|
| 4,400,711 | 8/1983 | Avery | 257/173 |
| 4,757,363 | 7/1988 | Bohm et al. | 257/358 |
| 4,939,616 | 7/1990 | Rountree | 257/173 |
| 5,012,317 | 4/1991 | Rountre | 257/173 |
| 5,140,401 | 8/1992 | Ker et al. | 257/357 |
| 5,181,092 | 1/1993 | Atsumi | 257/363 |
| 5,182,220 | 1/1993 | Ker et al. | 257/141 |

OTHER PUBLICATIONS

"A Process-Tolerant Input Protection Circuit for Advanced CMOS Processes", Roundtree et al., 1988 EOS-/ESD Symposium Proceedings, pp. 201–205.

"Input Protection Design for Overall Chip Reliability", Duvvury et al., 1989 EOS/ESD Symposium Proceedings, pp. 190–197.

*Primary Examiner*—Robert Limanek
*Assistant Examiner*—David B. Hardy
*Attorney, Agent, or Firm*—David J. Paul

[57] ABSTRACT

The input ESD protection circuit of the present invention uses a series n+ active area resistor placed in an n-well placed in series with shunt transistor all of which are in parallel with an SCR shunt to ground circuit, thereby providing greater than +/−7000V HBM (the Mil. Std. human body model (HBM) test model) and +/−600V MM EIAJ (the EIAJ machine model (MM) test model) ESD protection response. The series n+ active area resistor is placed inside an n-well as are all metal contacts to the input, to improve junction integrity during an ESD event. The parallel SCR circuit is designed in a layout that has an n+ diffusion area tied to $V_{SS}$ surrounding the n+/p+ diffusion inside the n-well on three sides to provide greater surface area for current distribution.

9 Claims, 3 Drawing Sheets

INPUT EDS PROTECTION CIRCUIT

This application is a continuation of U.S. application Ser. No. 07/935,605 filed Aug. 26, 1992, now abandoned.

FIELD OF THE INVENTION

This invention relates generally to electrostatic discharge (ESD) protection circuits for CMOS semiconductor devices and in particular to a specific input ESD protection circuit fabrication layout on a silicon substrate.

BACKGROUND OF THE INVENTION

Increasing pin counts, as well as faster circuit speeds, have compounded the need for reliable ESD protection in integrated circuits (ICs). Input/output signals to a complimentary metal oxide semiconductor (CMOS) circuit are typically fed to input/output pads which are connected to the gates of metal oxide semiconductor (MOS) transistors. If a high static discharge voltage is accidentally applied to any of the input/output pins of an IC, the input/output transistor's gate insulator and the contacts between the pad and the underlying active area are vulnerable to damage if adequate ESD protection is not present. Therefore, all pins of MOS ICs must be ESD protected to prevent any harmful static discharge voltages from damaging the IC.

Four main types of ESD protection circuits have been implemented in IC design which are intended to provide a current path to ground to absorb the high static discharge voltage. These four main ESD protection circuits include: 1) diode breakdown, 2) node-to-node punchthrough, 3) gate-field-induced breakdown, and 4) parasitic pnpn diode latchup.

Operation and construction of each of the four main types of ESD protection circuits have been described in various publications, such as the textbook "SILICON PROCESSING FOR THE VLSI ERA—VOLUME II, 1990, pp. 442–446 and therefore are not described further herein.

Also an input ESD protection circuit is described in two articles: the first article is entitled "A PROCESS-TOLERANT INPUT PROTECTION CIRCUIT FOR ADVANCED CMOS PROCESSES", Roundtree et. al., 1988 EOS/ESD SYMPOSIUM PROCEEDINGS, pp. 201–205, and the second article is entitled "INPUT PROTECTION DESIGN FOR OVERALL CHIP RELIABILITY", C. Duvvury et. al., 1989 EOS/ESD SYMPOSIUM PROCEEDINGS, pp. 190–197.

The first article describes a process-tolerant input protection circuit for advanced CMOS processes based on a lateral silicon controlled rectifier (LSCR). This article shows that LSCR devices when applied in many applications have failure thresholds of greater than +/−6000V. FIG. 2, of this article shows the LSCR device which is a variation of the pnpn-diode ESD protection circuit. The second article does a study on the LSCR circuit.

Though the LSCR circuit mentioned above provides reasonable ESD protection, even greater protection is desired. The input ESD protection circuit of the present invention provides greater than +/−7000V ESD protection response due to its unique circuit fabrication layout.

All articles and publications cited herein are hereby incorporated by reference.

SUMMARY OF THE INVENTION

The input ESD protection circuit of the present invention comprises a primary input protection circuit electrically connected to a secondary input protection circuit at an input pad conductor. The secondary circuit layout uses a series n+ active area resistor placed in an n-well that is connected to a shunt transistor, both of which are in parallel with the primary circuit layout comprising a SCR shunt to ground circuit, thereby providing greater than +/−7000V HBM (the Mil. Std. human body model [HBM] test model) and +/−600V MM EIAJ (the EIAJ machine model [MM] test model) ESD protection response.

The series n+ active area resistor is placed inside an n-well to improve its junction integrity during an ESD event. All metal contacts connected to the input pad have n-well underneath. The parallel SCR circuit is designed with a layout that has an n+ diffusion area tied to $V_{SS}$ surrounding the n+/p+ diffusion inside the n-well on three sides.

The preferred embodiment includes the fabrication layout combination of both the primary and secondary protection circuits which is described hereinafter, however either of the circuit layouts could be used separately or in combination with other input protection layouts as desired by one skilled in the art.

DETAILED DESCRIPTION OF THE PREFERRED EMBODIMENTS

The present invention, as depicted in FIGS. 1, 2, 3 and 4, has been fabricated and tested in a dynamic random access memory device and is described hereinafter for sake of illustration.

Figure 1:
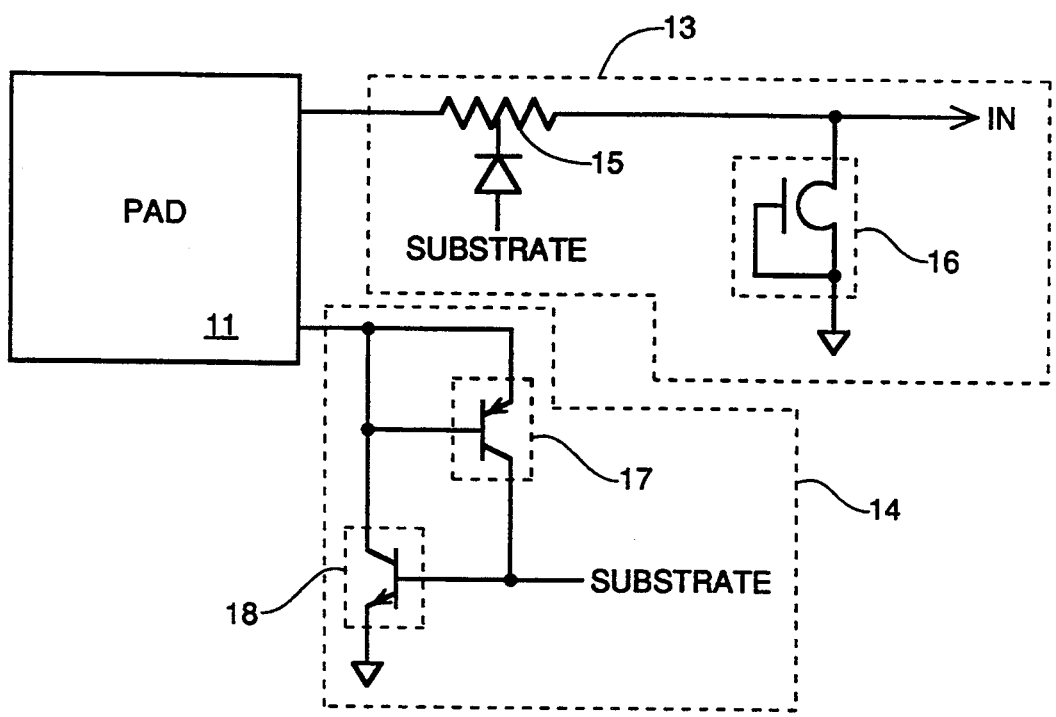
FIG. 1 depicts a schematical representation of the present invention.

Referring now FIG. 1, two parallel protection circuits 13 and 14 are shown connected to input pad 11. In protection circuit 13 an N+ active area resistor 15, having a resistance of approximately 1000Ω, is connected between input pad 11 and an input trace labeled as IN. Tied between the input trace and $V_{SS}$ is an n-channel shunt transistor 16 with its gate and source tied to ground.

Protection circuit 14, connected in parallel to protection circuit 13, is an SCR structure connected between input pad 11 and $V_{SS}$. Two bipolar transistors 17 and 18 make up the SCR structure with input pad 11 connected to the base and emitter of transistor 17 and to the collector of transistor 18. The collector of transistor 17 is then tied to the base of transistor 18 and to the substrate of the semiconductor die. The emitter of transistor 18 is connected to $V_{SS}$.

Specific operation of the parallel protection circuits 13 and 14 are not discussed in detail as SCR structures and shunt transistor operations are know in the art. However, the specific layout of the ESD protection circuits presented provide enhancements to conventional ESD circuits as will be discussed in the following text.

Figure 2:
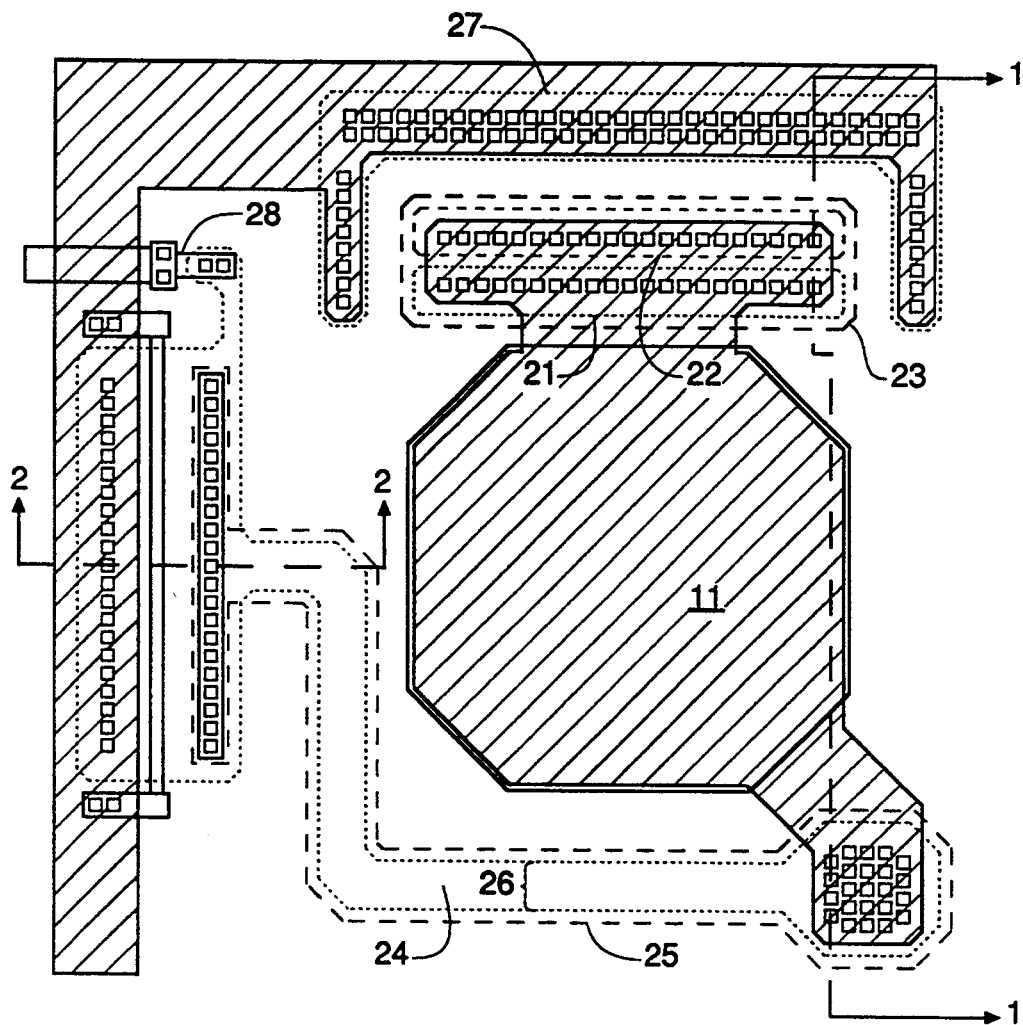
FIG. 2 depicts a top view fabrication layout of the present invention.

Referring now to the top layout view of FIG. 2, metal input pad 11 is shown connected by metal contacts to n+diffusion area 21 and p+ diffusion area 22. Both diffusion areas 21 and 22 are imbedded in n-well 23. An N+ diffusion area 27 is designed to surround three sides of diffusion areas 21 and 22 and connects to a $V_{SS}$ bus via metal contacts. This three sided N+ diffusion allows for an enhanced distribution of current, resulting from an ESD event, in that the SCR protection circuit is now larger in peripheral area than conventional built SCRs and thereby provides access to a larger area of the device's substrate into which to distribute current. Input pad 11 is further shown to connect to series N+ active area resistance 26 comprising an N+ active area 24 that resides in n-well area 25. Resistance 26 then connects to input interconnect 28 that in turn routes the input trace to the desired location(s) on the semiconductor device.

Figure 3:
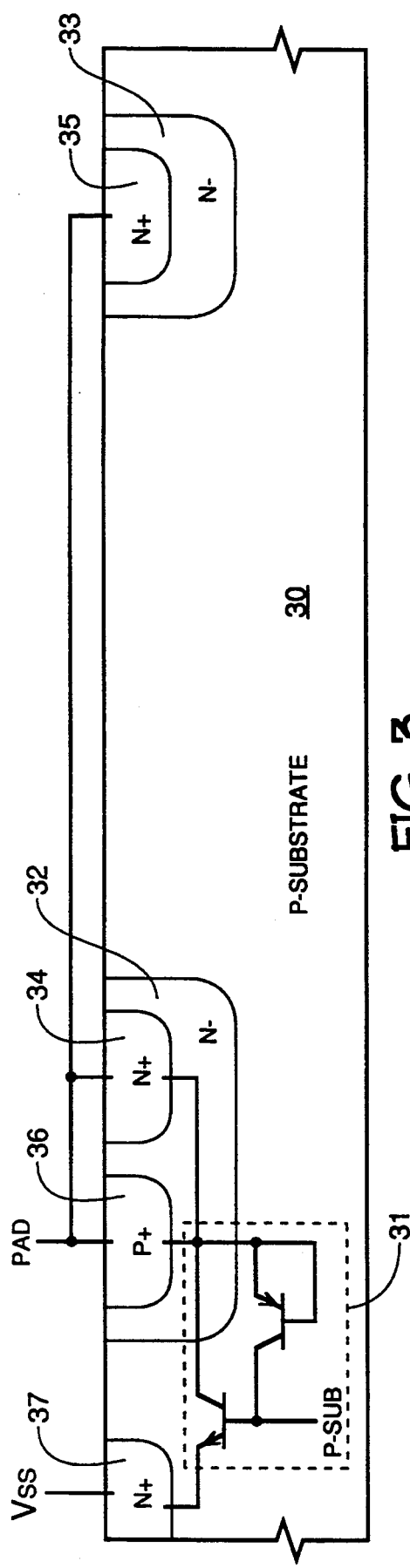
FIG. 3 depicts a composite cross-sectional view taken through line 1—1 of FIG. 2, featuring an SCR structure o existing between an input pad and $V_{SS}$.

Referring now to FIG. 3 (a cross-sectional view taken through line 1—1 of FIG. 2), a primary protection circuit to protect against stress voltages comprises an SCR structure 31 is shown schematically to illustrate the construction of this cross-sectional view. As seen, n-wells 32 and 33 are formed in p-substrate 30. N+ diffusion areas 34 and 35 are formed in n-wells 32 and 33, respectively, afterwhich p+ diffusion area 36 is also formed inside n-well 32. N+ area 37 is formed inside p-substrate 30 and then tied to a common potential (usually $V_{SS}$). Meanwhile diffusion areas 34, 35 and 36 are connected to a conductive input pad (usually metal).

Figure 4:
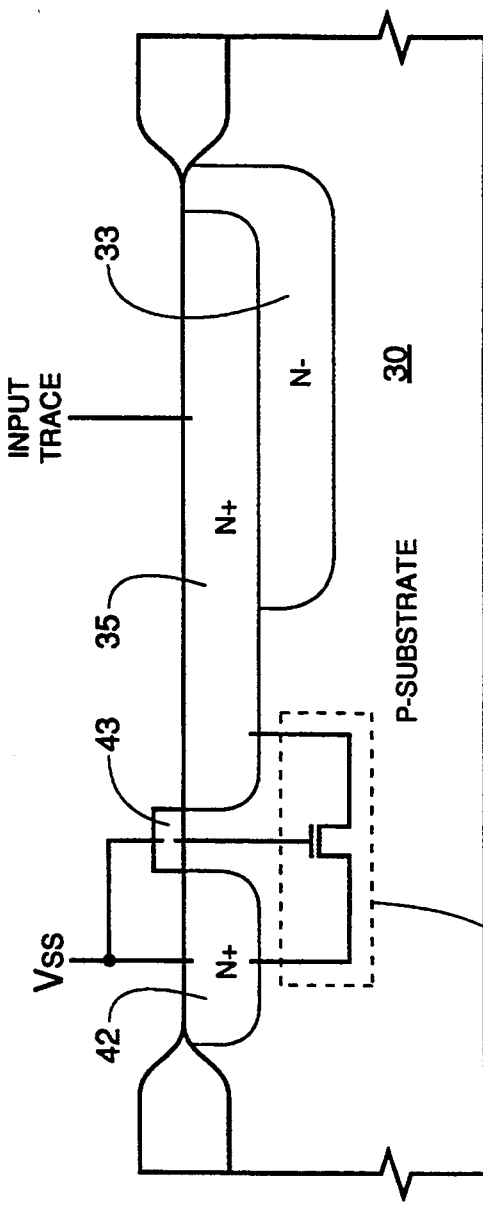
FIG. 4 depicts a composite cross-sectional view taken through line 2—2 of FIG. 2, featuring a diffusion resistor and shunt transistor between the input pad and an input trace.

Referring now to FIG. 4 (a cross-sectional view taken through line 2—2 of FIG. 2), a secondary protection circuit to provide protection against stress voltages, comprises a shunt transistor 41 as shown schematically to illustrate the transistor structure that results from the following device fabrication layout. N-well 33 (an extension of n-well 33 in FIG. 3) is again shown residing in p-substrate 30. N+ diffusion areas 42 and 35 are also formed into p-substrate 30 and bridged together with polysilicon gate 43 to form shunt transistor 41. Attention is brought to the portion of n+ diffusion 35 that resides inside n-well 33. This portion of diffusion 35 forms a series N+ active area resistor (in this case, approximately 1KΩ in resistance) which also functions as a distributed p-/n-/N+ diode from the p-substrate 30 to the pad. This resistor/diode combination reduces the amount of current passed through shunt transistor 41. When shunt transistor 41 becomes active, voltage will build up and eventually activate the SCR structure 31 (seen in FIG. 3) which provides an additional shunt to ground path for excessive current.

Also, as seen in both FIGS. 2, 3 and 4, all metal contacts to a diffusion region (either p+ or n+) have underlying n-well regions which in effect increase the depth of the contacts' underlying diffusion area. This increase in diffusion depth provides greater protection to the contact areas during an ESD event than do conventional fabrication layouts in that, as is expected, the metal contacts are also prone to receiving damaged during an ESD event as the electric field developed at the metal/diffusion area junction may be sufficient enough to penetrate into the substrate and allow the large surge of current to short the contact junction to the substrate. By increasing the diffusion depth underlying the contact junction, the ESD caused electric field now has a greater depth for the voltage to be dropped thereby protecting the contact junction from damage.

It is to be understood that although the present invention has been described in a preferred embodiment, various modifications known to those skilled in the art may be made without departing from the invention as recited in the several claims appended hereto. For example, the present invention is described in view of its implementation into a DRAM device, however any semiconductor device constructed from a CMOS process would enhance its input ESD protection capability by integrating the present invention into the fabrication layout. Also, it is conceivable that one skilled in the art may chose to use either the primary protection circuit with an existing secondary protection circuit or visa-versa without departing from the claimed invention.

I claim:

1. An electrostatic discharge (ESD) input protection circuit for a semiconductor device constructed in a substrate comprising:

a primary input protection circuit electrically connected to a secondary input protection circuit at an input pad conductor;

wherein said primary circuit is an SCR structure formed between said input pad, said common potential bus and said substrate, said SCR structure comprising:

first and second regions of first and second type conductive materials, respectively, both said regions being connected to said input pad conductor and residing inside a first well region of first type conductive material; and a third region of said first type conductive material connected to said common potential bus, said third region being spaced apart and bordering said first well region on three sides;

said SCR structure further comprising first an second bipolar transistors wherein said input pad is connected to the base and emitter of said first bipolar transistor and to the collector of said second bipolar transistor, the collector of said first bipolar transistor is connected to the base of said second bipolar transistor as well as to said substrate, and the emitter of said second bipolar transistor is connected to said common potential bus; and wherein said secondary input protection circuit comprises:

a first region of first type conductive material bridging between said input pad conductor and an input trace conductor, said first region having first and second ends with said first end connecting to said input pad conductor and said second end connecting to said input trace conductor, said first region residing inside a well region comprising said first type conductive material; and a second region of said second type conductive material bridged apart from said first region by a conductive terminal, said second region connected to a common potential bus;

wherein said first region forms an active area resistance residing in said well and said second region bridged apart said first region by said conductive terminal forms a shunt transistor.

2. The ESD input protection circuit of claim 1 wherein said first conductive material comprises n-type conductive dopants.

3. The ESD input protection circuit of claim 1 wherein said second conductive material comprises p-type conductive dopants.

4. The electrostatic discharge (ESD) input protection circuit of claim 1 wherein said resistance connects between said input pad conductor and said input trace conductor and said shunt transistor connects between said input trace conductor and said common potential bus whereby said shunt transistor gate and source are connected to said common potential bus and its drain is connected to said input trace conductor.

5. The ESD input protection circuit of claim 4 wherein said active resistance is a distributed p−/n−/n+ diode having a resistance of approximately 1000Ω.

6. An electrostatic discharge (ESD) input protection circuit for a dynamic random access memory semiconductor device constructed on a substrate comprising:

an SCR structure formed between an input pad, a common potential bus and said substrate, said SCR structure comprising:

a) first and second regions of first and second type conductive materials, respectively, both said regions being connected to an input pad conductor and residing inside a first well region of first type conductive material; and b) a third region of said first type conductive material connected to said common potential bus, said third region being spaced apart and bordering said first well region on three sides;

an active area resistance electrically connected in series to a shunt transistor circuit, both of which are formed between said input pad conductor and an input trace conductor comprising:

c) a fourth region of first type conductive material bridging between said input pad conductor and said input trace conductor, said fourth region having first and second ends with said first end connecting to said input pad conductor and said second end connecting to said input trace conductor, said fourth region residing inside a well region comprising said first type conductive material; and d) a fifth region of said second type conductive material bridged apart from said fourth region by a conductive terminal, said fourth region connected to said common potential bus;

wherein said fourth region forms an active area resistance residing in said well and said fifth region bridged apart from said fourth region by said conductive terminal forms a shunt transistor; and wherein said SCR structure further comprises first and second bipolar transistors wherein said input pad is connected t the base and emitter of said first bipolar transistor and to the collector of said second bipolar transistor, the collector of said first bipolar transistor is connected to the base of said second bipolar transistor as well as to said substrate, and the emitter of said second bipolar transistor is connected to said common potential bus.

7. The electrostatic discharge (EDS) input protection circuit of claim 6 wherein said resistance connects between said input pad conductor and said input trace conductor and said shunt transistor connects between said input trace conductor and said common potential bus whereby its gate and source are connected to said common potential bus and its drain is connected to said input trace conductor.

8. The ESD input protection circuit of claim 6 wherein said first conductive material comprises n-type conductive dopants and second conductive material comprises p-type conductive dopants.

9. The ESD input protection circuit of claim 6 wherein said active resistance is a distributed p−/n−/n+ diode having a resistance of approximately 1000Ω.

* * * * *